United States Patent
Cooper et al.

(10) Patent No.: US 11,125,799 B2
(45) Date of Patent: Sep. 21, 2021

(54) SYSTEMS FOR DETECTING ELECTRICAL FAULTS IN A VEHICLE

(71) Applicant: Transportation IP Holdings, LLC, Norwalk, CT (US)

(72) Inventors: Jared Klineman Cooper, Palm Bay, FL (US); David Michael Peltz, Melbourne, FL (US); Nicholas David Nagrodsky, Melbourne, FL (US); Samuel William Golden, Melbourne, FL (US); Jerod Reid Svidunovich, Melbourne, FL (US); Keith Allen Heob, Melbourne, FL (US); Michael Copps, Melbourne, FL (US)

(73) Assignee: Transportation IP Holdings, LLC, Norwalk, CT (US)

( * ) Notice: Subject to any disclaimer, the term of this patent is extended or adjusted under 35 U.S.C. 154(b) by 0 days.

(21) Appl. No.: 16/726,994

(22) Filed: Dec. 26, 2019

(65) Prior Publication Data

US 2020/0132748 A1    Apr. 30, 2020

Related U.S. Application Data

(63) Continuation of application No. 16/373,262, filed on Apr. 2, 2019, now Pat. No. 10,557,885, which is a continuation of application No. 14/993,078, filed on Jan. 11, 2016, now Pat. No. 10,288,666.

(60) Provisional application No. 62/101,399, filed on Jan. 9, 2015.

(51) Int. Cl.
*G01R 31/08*    (2020.01)
*G01R 31/00*    (2006.01)

(52) U.S. Cl.
CPC .......... *G01R 31/086* (2013.01); *G01R 31/007* (2013.01)

(58) Field of Classification Search
CPC ................ G01R 31/086; G01R 31/007; G01R 31/50–58; G01R 31/005–008
See application file for complete search history.

(56) References Cited

U.S. PATENT DOCUMENTS

| | | | | |
|---|---|---|---|---|
| 5,539,602 | A * | 7/1996 | Schmitz | H02H 3/32 361/42 |
| 2006/0186105 | A1 * | 8/2006 | Voeltzel | B32B 17/10036 219/203 |
| 2007/0008666 | A1 * | 1/2007 | Morita | B60L 3/0023 361/42 |
| 2010/0268507 | A1 * | 10/2010 | Sorensen | G01R 31/58 702/120 |

* cited by examiner

*Primary Examiner* — Daniel R Miller
(74) *Attorney, Agent, or Firm* — The Small Patent Law Group LLC; John P. Darling

(57) ABSTRACT

Systems are provided to determine a location of an electrical fault in an electrical system of a vehicle. A test apparatus can include a control unit and a plurality of scan circuits. The control unit is configured to electrically couple the plurality of scan circuits to the electrical system and trigger the plurality of scan circuits to pass electrical signals to the electrical system. Each scan circuit is configured to detect a presence of an electrical fault in the electrical system based on an electrical signal passed. Each scan circuit provides information indicative of a location of the electrical fault in the electrical system, when detected, to the control unit.

19 Claims, 9 Drawing Sheets

SYSTEMS FOR DETECTING ELECTRICAL FAULTS IN A VEHICLE

CROSS-REFERENCE TO RELATED APPLICATIONS

This application is a continuation of U.S. patent application Ser. No. 16/373,262, filed on 2 Apr. 2019 (now U.S. Pat. No. 10,557,885), which is a continuation of U.S. patent application Ser. No. 14/993,078, filed on 11 Jan. 2016 (now U.S. Pat. No. 10,288,666), which claims priority to U.S. Provisional Application No. 62/101,399, filed on 9 Jan. 2015. The entire disclosures of these applications are incorporated herein by reference.

BACKGROUND

Technical Field

Embodiments of the subject matter disclosed herein relate to detecting electrical faults in an electrical system of a vehicle.

State of the Art

Modern vehicles include complex control systems and power systems that involve multiple components dispersed throughout the vehicle and extensive wiring interconnecting the components. In operation, a vehicle can experience significant vibration. Over time, wiring and other interconnections of the vehicle can exhibit signs of wear due to reoccurring stresses associated with regular operation. Deterioration of the wiring can introduce faults that prevent proper operation of the vehicle, or can lead to unexpected or unintended, and therefore, dangerous operation of the vehicle.

When an existence of a fault becomes known, service personnel undertake a laborious effort of locating the fault. This process can involve manually testing, with leads, individual wires, circuits, or conductors to determine whether the fault is located therein. Given the extensive amount of wiring, interconnections between wiring, electrical devices, and other electronic equipment present in the vehicle, the mere task of uncovering the problem is time-consuming and expensive. This expense is additional to the cost of repairing or replacing the faulty component, once identified.

BRIEF DESCRIPTION

In an embodiment, a system (e.g., an electrical fault location detection system) includes a fault location unit and a control unit. The control unit is configured to electrically couple the fault location unit to an electrical system of a vehicle and to trigger the fault location unit to pass an electrical signal to the electrical system. When the electrical signal is passed to the electrical system, the fault location unit provides information to the control unit indicative of a location of an electrical fault in the electrical system.

In an embodiment, a method (e.g., method for detecting a location of an electrical fault in a vehicle) includes receiving, from a power system of a vehicle, a signal indicative of an occurrence of an electrical fault in an electrical system of the vehicle. The method also includes triggering a fault locating circuit to pass electrical signals to the electrical system of the vehicle. In addition, the method includes receiving, from the fault locating circuit, a signal indicative of a location of the electrical fault in the electrical system. Further, the method can include outputting information relating to the location of the electrical fault in the electrical system to at least one of an operator of the vehicle or an entity remote from the vehicle.

In an embodiment, a system (e.g., an electrical fault location detection system) includes a control unit for a vehicle and a plurality of scan circuits in the vehicle. The control unit is configured to electrically couple the plurality of scan circuits to an electrical system of the vehicle. The control unit is further configured to trigger the plurality of scan circuits to respectively pass a plurality of electrical signals to the electrical system of the vehicle. Respective scan circuits of the plurality of scan circuits are respectively configured to detect a presence of an electrical fault in the electrical system based on respective electrical signals of the plurality of electrical signals. The respective scan circuits are further configured to provide information indicative of a location of the electrical fault in the electrical system, when detected, to the control unit.

In an embodiment, a system (e.g., an electrical fault location detection system) includes a fault location unit/system having plural scan circuits that are respectively electrically connected to plural electrical circuits in an electrical system of a vehicle and configured to apply respective electrical signals to the plural electrical circuits. The system further includes a control unit configured for electrical communication with the plural scan circuits in the vehicle. The plural scam circuits are further configured to receive secondary signals respectively generated by the plural electrical circuits responsive to the electrical signals applied by the plural scan circuits to the plural electrical circuits, and to communicate information of the secondary signals that are received to the control unit. The control unit is configured to determine a location of an electrical fault in the electrical system based on the information received from the plural scan circuits. The control unit is further configured to control at least one electronic device based on the location of the electrical fault that is determined.

In an embodiment, a system (e.g., an electrical fault location detection system) includes at least one scan circuit on board a vehicle, a control unit, and a coupling circuit on board the vehicle. The coupling circuit is electrically connected to the at least one scan circuit and to plural electrical circuits of an electrical system of the vehicle. The control unit is configured to control the coupling unit to selectively electrically couple the at least one scan circuit to the plural electrical circuits. The at least one scan circuit is configured, when electrically coupled to the electrical circuits, to apply respective electrical signals to the plural electrical circuits and to receive secondary signals respectively generated by the plural electrical circuits responsive to the electrical signals. The at least one scan circuit is further configured to communicate information of the secondary signals that are received to the control unit. The control unit is configured to determine a location of an electrical fault in the electrical system based on the information received from the at least one scan circuit. The control unit is further configured to control at least one electronic device based on the location of the electrical fault that is determined.

BRIEF DESCRIPTION OF THE DRAWINGS

Reference is made to the accompanying drawings in which particular embodiments and further benefits of the invention are illustrated as described in more detail in the description below, in which.

DETAILED DESCRIPTION

Figure 1:
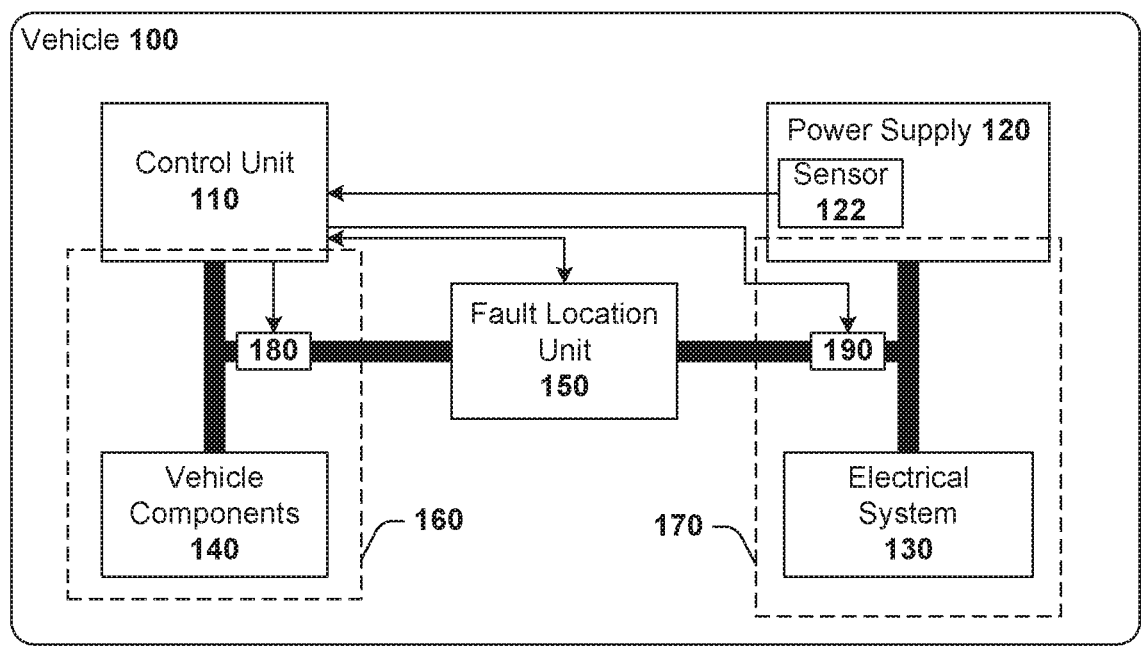
FIG. 1 illustrates a schematic block diagram of an exemplary, non-limiting embodiment of a fault location system for a vehicle according to one or more aspects.

Embodiments described herein generally relate to systems and methods for locating an electrical fault in an electrical system of a vehicle. The vehicle can include an extensive amount of wiring running throughout. In addition to the wiring, the vehicle can also include numerous electrical interconnections, control lines, electrical devices, and/or other electronic devices that can be further a cause of the electrical fault. Conventionally, narrowing down a location of the electrical fault can involve manually testing individual components (e.g., wire, interconnections, device, etc.) separately to pinpoint the culprit. In order to test the components, service personnel generally gain physical access. Accordingly, to merely locate a source of the electrical fault, portions and/or components of the vehicle are disassembled to enable the test.

Fault locating systems and methods described herein reduce manual and laborious efforts to identify a source of an electrical fault in a vehicle. In addition, the fault locating systems and methods herein generally eliminate gaining physical access prior to performing an actual repair of a faulty component. Accordingly, overall service time for electrical faults is reduced.

As utilized herein, the term "vehicle" refers to any transportation system including, but not limited to, motor vehicles (e.g., motorcycles, automobiles, trucks, busses, traction vehicles, etc.) for transport on ground, watercraft (e.g., boats, ships) for transport on water, aircraft (e.g., planes, rotorcrafts) for transport in air, and/or spacecraft for transport outside an atmosphere. "Traction vehicles", as utilized herein, can refer to rail vehicles such as locomotives, off-highway vehicles, transit vehicles, or the like. Given this broad usage of the term "vehicle", it is to be appreciated that, as utilized herein, a vehicle can be a single-compartment, permanently-arranged transportation system or a multiple-compartment, variably-arranged transportation system. Accordingly, the use of "vehicle" herein is intended to encompass transportation systems, capable of mobility on or through a variety of media, that include one or more compartments, which are respectively interchangeable, detachable, removable, etc., such that a combination of such compartments is considered a "vehicle".

According to one or more aspects, a vehicle can include a control unit for monitoring and controlling various vehicle components. The control unit can be, for example, a microprocessor-based device having a processor and a memory for storing data and/or programs executed by the processor. The control unit can further include user interface devices to enable interactions with an operator of the vehicle and a communication device to enable communications with off-board devices or entities.

As utilized herein, the terms "controller", "control unit", "control system", or "control device" are used broadly herein and refer to anything from a simple switching device, to one or more processors running computer-executable software instructions, to complex programmable and/or non-programmable logic circuitry. Moreover, the terms "signal", "data", and "information" can be used interchangeably herein and, further, can be in digital or analog form. The terms "software", "computer program", or "program" include, but are not limited to, one or more computer-readable and/or executable instructions that cause a computer or other electronic device to perform functions, actions, and/or behave in a desired manner. It will be appreciated by one of ordinary skill in the art that a form of software is dependent on, for example, requirements of a desired application, an environment the software executes in, and/or desires of a designer/programmer. The terms "computer", "processing device", "computing device", or "processor", as used herein, includes, but are not limited to, any programmed or programmable device that can store, retrieve, and process data. "Non-transitory computer-readable media" include, but are not limited to, a CD-ROM, a removable flash memory card, a hard disk drive, a magnetic tape, and a floppy disk. "Computer memory" or "memory", as used herein, refers to a storage device configured to store digital data or information which can be retrieved by a computer or processing element.

In a further aspect, the vehicle can further include a power system having a power supply for providing electrical power to an electrical system of the vehicle. The power supply can include batteries, engines, generators, alternators, etc. that separately or jointly provide power to the electrical system. In this regard, the vehicle can include wiring, interconnections, and the like to couple the control unit to vehicle components for control and monitoring, but the vehicle can also include wiring, interconnections, and the like to couple the power supply to vehicle components for provisioning electrical power.

Herein, interconnections or wiring associated with control or data signals (i.e., the control system) can be described as separate from interconnections or wiring supplying electrical power (i.e., the electrical system or power system). However, it is to be appreciated that, since the power driving the control or data signals of the control system is derived from the power supply, the control system (and the wiring and interconnections therein) are considered to be a portion of the electrical system. The separate description of the control system from the power system is provided for convenience to describe modified techniques applicable to a control environment. Accordingly, except where explicitly described as applicable to the control system, the structures and techniques described herein with regarding to the electrical system of the vehicle are employable with the wiring, interconnections, and devices of the control system.

As utilized herein, a "vehicle component" can refer to substantially any electrical or electronic component installed or included in a vehicle. For control aspect, a vehicle component can be any device having an embedded control unit, or the embedded control unit. However, vehicle components can also include mechanical and/or electrical components, without embedded control or considered separate from associated embedded control units, such as engines, generators, alternators, electrical supply components (e.g., batteries), gauges, meters, communication equipment, lighting, sensors, switches, wiring harnesses, etc. By way of example, in the case of a traction vehicle, vehicle components can include generators, alternators, rectifiers, engines, turbo chargers, cooling blowers, dynamic braking grids, inverters, converters, traction motors, etc. However, it is to be appreciated that vehicle components, as utilized herein, is not limited to the aforementioned enumerated examples and is intended to encompass any electrical or electronic components of a vehicle which draw power from the power supply and/or can be controlled via the control unit.

In one or more embodiments, a fault location unit of a vehicle (which can be controlled or driven by a control unit of the vehicle in some embodiments) is provided to locate an electrical fault within an electrical system (or control system) of the vehicle. As utilized herein, the term "electrical fault" refers to a diversion of current along an unintended path. For instance, a diversion of current from a source path (e.g., positive or hot) to a return path (e.g., negative or neutral) is a short. A diversion of current to ground is a ground fault. These types of faults can also be referred to as "leakage currents".

The fault location unit can pass one or more electrical signals to the electrical system, and on the basis of those electrical signals, identify a location of the electrical fault with in the electrical. Depending on a distribution of the electrical signals passed to the electrical system, the location identified can specify a particular circuit, cable, wire harness, vehicle component, vehicle system, or an individual wire or interconnect. The electrical signals can originate (i.e., generated by) from circuits of the fault location unit. Alternatively, the electrical signals can be provided to the fault location unit from the control unit, for example. The electrical signals, when applied to the electrical system, generate secondary signals, which can be analyzed to determine the location of the electrical fault. The secondary signals can be return signals or received signals, which represent the originally passed signals as modified by electrical paths of the electrical system. The secondary signals, under normal conditions, exhibit a predetermined behavior. The presence of the electrical fault causes deviations from the predetermined behavior that can be detected from measurements of the secondary signals. Accordingly, depending on a position, within the electrical system, where a secondary signal is measured and a position where a corresponding applied signal is passed, the location of the electrical fault is determined.

The fault location unit can include one or more scan circuits respectively configured to apply an electrical signal to a portion of the electrical system, i.e., an electrical path of the electrical system. The electrical path, according to one or more aspects, can be a particular circuit, a particular length of wire, a cable including a plurality of individual wires, a wire harness, or a sub-system or sub-network of the electrical system. A secondary signal, received from or modified by the electrical path, can be returned to the scan circuit. According to one example, the scan circuit can include an evaluation circuit to compare the secondary signal to the applied signal (or some other reference) to determine a difference. When the difference exceeds a threshold, unintended diversion of current can be a cause. Accordingly, when the threshold is exceeded, the scan circuit emits a detection signal indicating a presence of an electrical fault on the electrical path. In another example, the secondary signal can be provided to the control unit for evaluation.

The scan circuit can include a pair of circuits or cells, where a first cell applies the signal to the electrical path and the second cell receives the return, response, or secondary signal. The first cell and the second cell can jointly operate to implement the evaluation circuit. Alternatively, the second cell can include a dedicated circuit implementing the evaluation functionality.

In an aspect, the fault location unit can include a plurality of scan circuits which are designated to predetermined portions or electrical paths of the electrical system. In this regard, an identity of the particular scan circuit that reports detection of the electrical fault provides the location information. Again, depending on a number of scan circuits provided and a level to which the electrical system is partitioned or segmented for the purposes of assignment to scan circuits, the location information can be provided at a sub-system level, a circuit level, a cable level, or an individual wire or interconnect level. For example, a scan circuit can be provided to each wire or interconnect of the electrical system. Alternatively, one or more scan circuits can be selectively, and separately, coupled to different wires, circuits, or interconnects so as cycle and test each individually.

The fault location unit, and particularly the scan circuits thereof, can be isolated from the electrical system when not in use. A coupling circuit can maintain the fault location unit in isolation until the electrical fault occurs. At that time, the coupling circuit can electrically couple the fault location unit to the electrical system to enable operation. As utilized herein, the term "electrically couple" refers to establishing a connection that enables at least one of information or a signal to pass, either with or without any sort of physical coupling or contact.

According to an additional aspect, the power supply can include a sensor configured to detect an occurrence of the electrical fault within the electrical system as a whole. This information can be provided to the control unit for initiation of self-testing (i.e., self-locating) for the electrical fault. Further, the control unit can display a warning or other information related to the electrical fault on a display device for an operator of the vehicle. The control unit can signal for the fault location unit to be coupled to the electrical system and, further, can trigger the fault location unit to begin diagnosing the electrical system. The fault location unit can be triggered in response to a user input received from the operator via a user interface.

Prior to triggering the fault location unit, the control unit can determine whether the vehicle is in a safe state. As utilized herein, a "safe state" is any state of the vehicle in which spurious signals, currents, or voltages applied to the electrical system are tolerated and will not cause a dangerous situation or result. By way of example, while in a safe state, the vehicle will not behave erratically or unexpectedly should the signal applied by the fault location unit be interpreted as a throttle signal, for example. Safe states can include an idle state, a stationary state, a tie-down state (i.e., brakes applied), a disassembled or pre-assembly state, or the like.

The control unit, once provided with information related to the location of the electrical fault, can output such information to the display device and/or communicate the information to an entity remote from the vehicle. As utilized herein, "an entity remote from the vehicle" can be a computing device which is not physically or electrically coupled to the vehicle. As utilized herein, the entity is not intended to be limited to being geographically or physical remote from the vehicle. For instance, in one embodiment, the entity can be a mobile device carried by the operator or other service personnel aboard the vehicle. In other embodiments, the entity can be a computing device at a service location, a storage location, or some other vehicle station.

According to one embodiment, a system for locating electrical faults is described. The system includes a fault location unit and a control unit. The control unit is configured to electrically couple the fault location unit to an electrical system of a vehicle and to trigger the fault location unit to pass an electrical signal to the electrical system. When the electrical signal is passed to the electrical system, the fault location unit provides information to the control unit indicative of a location of an electrical fault in the electrical system.

According to one example, the system can include a sensor for detecting an occurrence of the electrical fault in the electrical system. The sensor is configured to send a signal indicative of the occurrence of the electrical fault to the control unit when detected. The system further includes a power supply configured to provide electrical power to the electrical system of the vehicle. The sensor can be coupled to the power supply.

In another example, the control unit is configured to verify the vehicle is in a safe state prior to electrically coupling the fault location unit to the electrical system. According to another example, the system includes a coupling circuit configured, in a first mode of operation, to selectively couple the fault location unit to the electrical system, and in a second mode of operation to isolate the fault location unit from the electrical system.

According to one example, the fault location unit includes a scan circuit configured to pass a signal to an electrical path of the electrical system to detect a presence of the electrical fault in the electrical path to which the scan circuit is coupled. The scan circuit can include an evaluation circuit to compare the signal transmitted on the electrical path to a signal later received on the electrical path. The evaluation circuit is configured to output a detection signal when a difference in the signal transmitted and the signal received exceeds a threshold.

The scan circuit, according to some examples, includes a first cell and a second cell. The first cell is configured to pass the electrical signal on the electrical path and the second cell is configured to receive the electrical signal on the electrical path. In one example, the electrical path can be a circuit such that the first cell transmits the electrical signal on a first wire and the second cell receives the electrical signal on a second wire that completes the circuit. In another example, the electrical path is a length of wire such that the first cell transmits the electrical signal on the length of wire to the second cell.

The fault location unit can be configured to individually and cyclically couple the scan circuit to a plurality of portions of the electrical system to test each portion for the electrical fault.

Further, the control unit can include a user interface device having at least a display device configured to display information to an operator of the vehicle and a communication interface configured to communicate with an entity remote from the vehicle. The control unit can be configured to at least one of output the information indicative of the location of the electrical fault in the electrical system to the display device, or transmit the information, via the communication interface, to an entity remote from the vehicle.

According to another embodiment, a method for locating an electrical fault is described. The method includes receiving, from a power system of a vehicle, a signal indicative of an occurrence of an electrical fault in an electrical system of the vehicle. The method also includes triggering a fault locating circuit to pass electrical signals to the electrical system of the vehicle. In addition, the method includes receiving, from the fault locating circuit, a signal indicative of a location of the electrical fault in the electrical system. Further, the method includes outputting information relating to the location of the electrical fault in the electrical system to at least one of an operator of the vehicle or an entity remote from the vehicle.

In accordance with an example, the method can further include electrically coupling the fault locating circuit to the electrical system of the vehicle in response to the signal indicative of the occurrence of the electrical fault from the power system, and otherwise isolating the fault locating circuit from the electrical system. In further examples, the method can include determining a state of the vehicle, and verifying the state of the vehicle is a safe state prior to triggering the fault locating circuit.

In yet another example, the method can include passing a signal to an electrical path of the electrical system to detect a presence of the electrical fault in the electrical path. In addition, the method includes comparing the signal transmitted on the electrical path to a signal received on the electrical path, determining when a difference in the signal transmitted and the signal received exceeds a threshold, and issuing the signal indicative of the location of the electrical fault when the threshold is exceeded. The location indicated by the signal specifies the electrical path.

In yet another embodiment, a system is described that includes a control unit for a vehicle and a plurality of scan circuits in the vehicle. The control unit is configured to electrically couple the plurality of scan circuits to an electrical system of the vehicle and trigger the plurality of scan circuits to respectively pass a plurality of electrical signals to the electrical system of the vehicle. Moreover, respective scan circuits of the plurality of scan circuits are respectively configured to detect a presence of an electrical fault in the electrical system based on respective electrical signals of the plurality of electrical signals. The respective scan circuits are further configured to provide information indicative of a location of the electrical fault in the electrical system, when detected, to the control unit.

According to an example of the foregoing embodiment, respective scan circuits of the plurality of scan circuits respectively comprise a pair of circuits configured to pass a test signal to a designated portion of the electrical system and receive a response signal from the designated portion of the electrical system. The pair of circuits output a detection signal to the control unit when a difference between the test signal and the response signal exceeds a threshold. The control unit determines the location of the electrical fault based on the designated portion of the electrical system associated with the pair of circuits which output the detection signal.

With reference to the drawings, like reference numerals designate identical or corresponding parts throughout the several views. However, the inclusion of like elements in different views does not mean a given embodiment necessarily includes such elements or that all embodiments of the invention include such elements.

Figure 2:
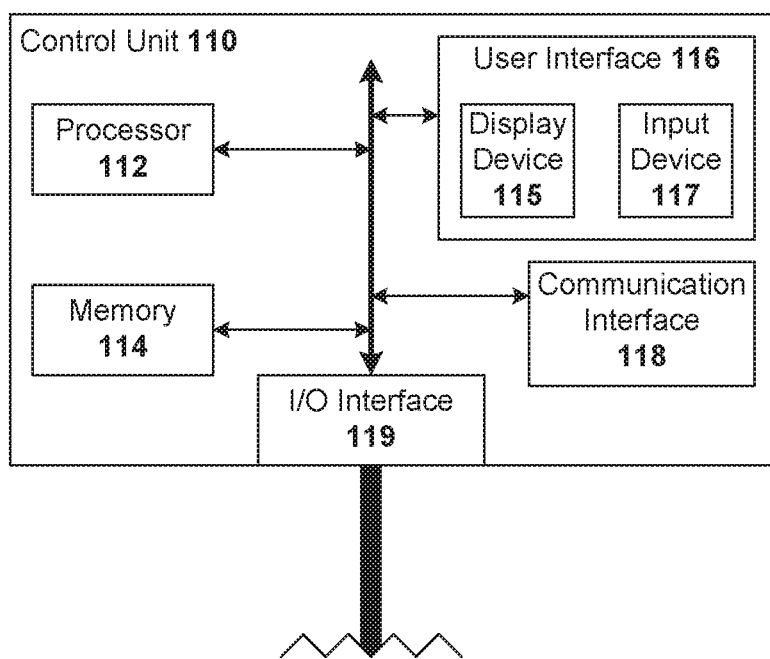
FIG. 2 illustrates a schematic block diagram of an exemplary, non-limiting embodiment of a control unit for a vehicle in accordance with one or more aspects.

Turning to FIG. 1, illustrated is a schematic block diagram of an exemplary, non-limiting embodiment of a fault location system for a vehicle 100. In the embodiment, the vehicle 100 includes a control unit 110 for controlling and monitoring vehicle components 140 via a control path 160. As shown in FIG. 2, the control unit 110 includes a processor 112, a memory 114, a user interface 116, a communication interface 118, and an I/O interface 119. The user interface 116 can include a display device 115 to output information to an operator of the vehicle and an input device 117 to obtain information from the operator. The display device 115 can be a display screen, a segment display, a series of graphical elements which can be illuminated, gauges, meters, or the like. The input device 117 can include keyboards, pointing devices, buttons, switches, knobs, dials, or the like. It is to be appreciated that the display device 115 and the input device 117 can be contained within a single device, e.g. touch screen, such that user interface 116 comprises a graphical user interface generated by the processor 112 based on computer-executable instructions (e.g., a control application) stored on memory 114.

In an aspect, the control unit 110 can communicate via a wired or wireless medium. For instance, the communication interface 118 can enable the control unit 110 to communicate via a cable, e.g., USB cable, serial cable, Ethernet cable, or the like. In another example, the communication interface 118 provides wireless communications via WiFi (e.g., IEEE 802.11), cellular radio (e.g., GSM, LTE, CDMA, HSPA, UMTS, WiMAX, etc.), satellite communication, near-field communication, infrared, a short-range radio frequency (RF) protocol such as Bluetooth, or substantially any other wireless communication technology.

The I/O interface 119 includes the external connectors to couple the control unit 110 to the control path 160 to enable communication with vehicle components 140. The I/O interface 119 further includes the internal interconnections, adapters, and circuits to couple to processor 112. The I/O interface 119 can transform signals or data from a format suitable for processing by the control unit 112 to a format suitable for transmission via the control path 160 and/or a format suitable for consumption by the vehicle components 140. Likewise, the I/O interface 119 can perform a complementary transformation on incoming data or signals.

Figure 3:
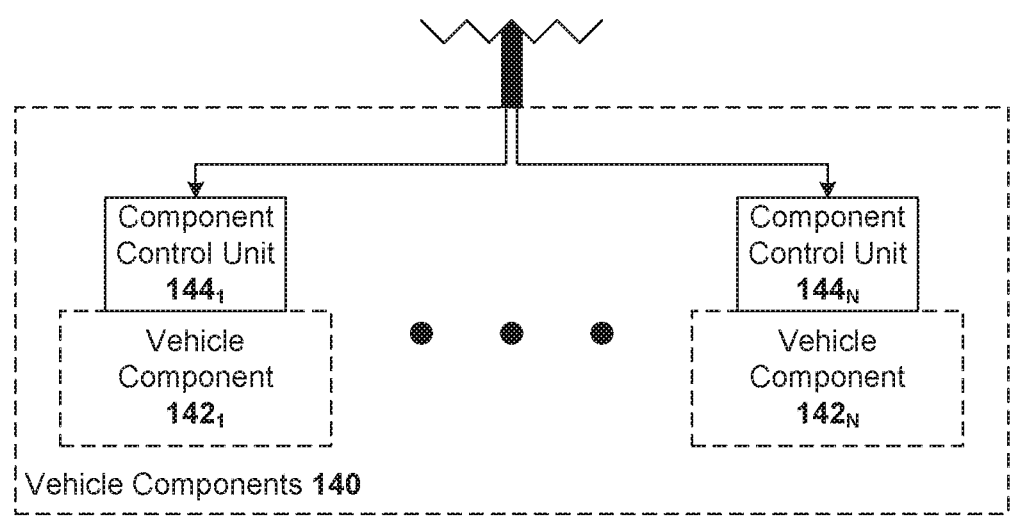
FIG. 3 illustrates a schematic block diagram of an exemplary, non-limiting embodiment of vehicle components according to one or more aspects.

Turning briefly to FIG. 3, vehicle components 140 can include one or more individual vehicle components 142 (depicted as vehicle components $142_1$ through $142_N$, where N is any integer greater than or equal to one), such as various electrical, mechanical, or control components. Each vehicle component 142 can include a corresponding component control unit 144, which is an endpoint on the control path 160 for communications with the control unit 110.

Turning back to FIG. 1, the vehicle 100 also includes a power supply 120 for providing electrical power to an electrical system 130 via an electrical supply path 170. As described above, the electrical system 130 and the electrical supply path 170 can encompass, in some embodiments, the control path 160, the vehicle component 140, and the wires, interconnections, etc. of the control path 160. That is, when discussing the electrical system 130, it is intended to include the control path 160 and the vehicle components 140, unless explicitly stated otherwise.

As shown in FIG. 1, a sensor 122 is provided for detecting an occurrence of an electrical fault in the electrical system 130. According to one example, the sensor 122 can be coupled to or included in the power supply 120. The sensor 122 can register a voltage drop, for example, or measure a return current to determine whether any unintended diversion of current is occurring within the electrical system 130. Once the electrical fault is detected, the sensor 122 can send a signal to the control unit 110.

The control unit 110, in response to the signal from the sensor 122, can output a notification of the electrical fault to the user interface 116 and initiate a self-testing routine to locate the electrical fault. According to one example, the self-testing can commence autonomously upon receiving the signal from sensor 122. In another example, user input via user interface 116 is received to begin self-testing.

To initiate self-testing, the control unit 110 electrically couples a fault location unit 150 to the electrical system 130. For instance, the control unit 110 can pass signals to coupling circuits 180, 190 to electrically couple the fault location unit 150 to the electrical supply path 170 and/or the control path 160, thereby attaching the fault location unit 150 to the electrical system 130. The coupling circuits 180, 190, according to an aspect, are configured to electrically isolate the fault location unit 150 from the electrical system 130 except when the signal is passed from the control unit 110.

Once coupled, the fault location unit 150 can be brought on-line by the control unit 110. Once activated, the fault location unit 150 can apply electrical signals to the electrical system 130 to identify a location of the electrical fault therein. Once identified, the fault location unit 150 provides location information to the control unit 110. The location information can be displayed on a display screen of the user interface 116 and/or transmitted to an entity remote from vehicle 100 via communication interface 118.

Prior to triggering the fault location unit 150, the control unit 110 can determine a state of the vehicle 100. For instance, the control unit 110, via the control path 160, can interrogate vehicle components 140 to ascertain current statuses thereof. In another example, the control unit 110, which can receive regular streams of information from vehicle components 140, can determine the state based on data stored on memory 114 or some other non-transitory, computer-readable media. In addition, the control unit 110 can determine state the based on a snapshot of a stream of data. Once the state of vehicle 100 is identified, the control unit 100 triggers the fault location unit 150 when the vehicle is in a safe state.

Figure 4:
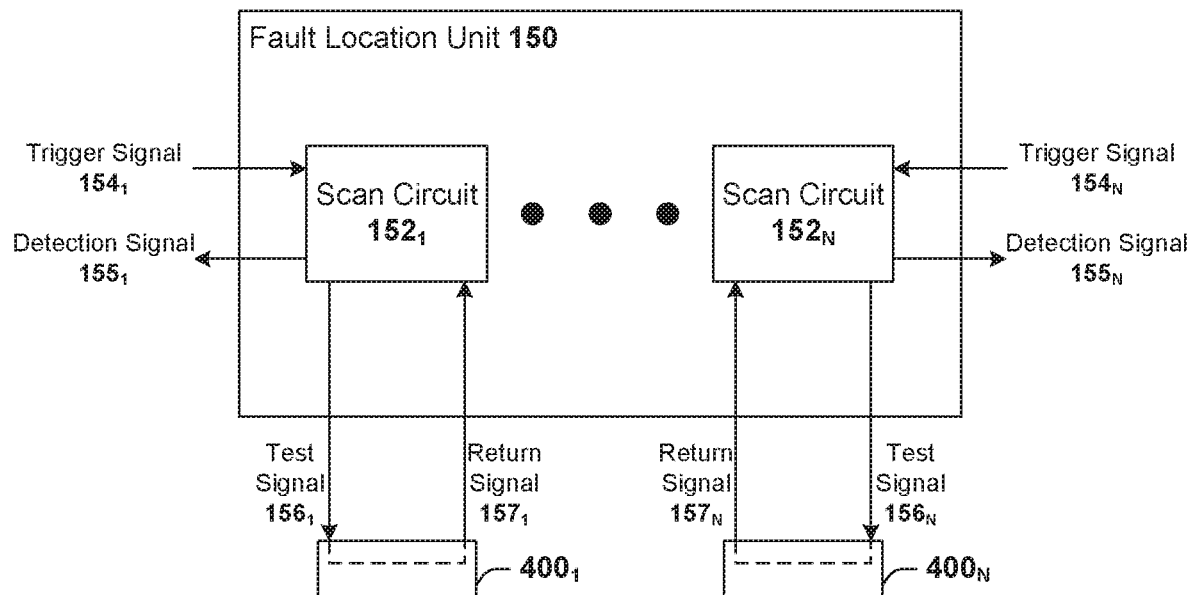
FIG. 4 illustrates a schematic block diagram of an exemplary, non-limiting embodiment of a fault location unit for a vehicle.

Turning to FIG. 4, illustrated is a schematic block diagram of an exemplary, non-limiting embodiment of the fault location unit 150. As shown in FIG. 4, the fault location unit 150 can include one or more scan circuits 152 (depicted as scan circuit 152.sub.1 through scan circuit 152.sub.N, where N is any integer greater than or equal to one). Each scan circuit 152 can be configured to receive a trigger signal 154, from control unit 110 for example, which initiates a test procedure for at least a portion of the electrical system 130.

For the test procedure, the scan circuit 152 applies a test signal 156 to an electrical path 400 of the electrical system 130. The electrical path 400 can be an individual wire, an individual electrical component, a circuit, a portion of a circuit, a sub-system, or the like. In response, the scan circuit 152 receives a secondary signal or return signal 157, which represents the test signal 156 as modified by the electrical path 400. Scan circuit 152 can evaluate the return signal 157 to determine whether the electrical fault is present on the electrical path 400. If so, the scan circuit 152 sends a detection signal 155 to the control unit 110.

According to an aspect, each scan circuit 152 can be associated with a particular respective portion of the electrical system 130 (e.g., a particular wire, interconnection, circuit or portion thereof). As such, the detection signal 155 is indicative of a location of the electrical fault, since the detection signal 155 from a given scan circuit 152 indicates the electrical fault is located in the portion of the electrical system 130 associated therewith.

Figure 5:
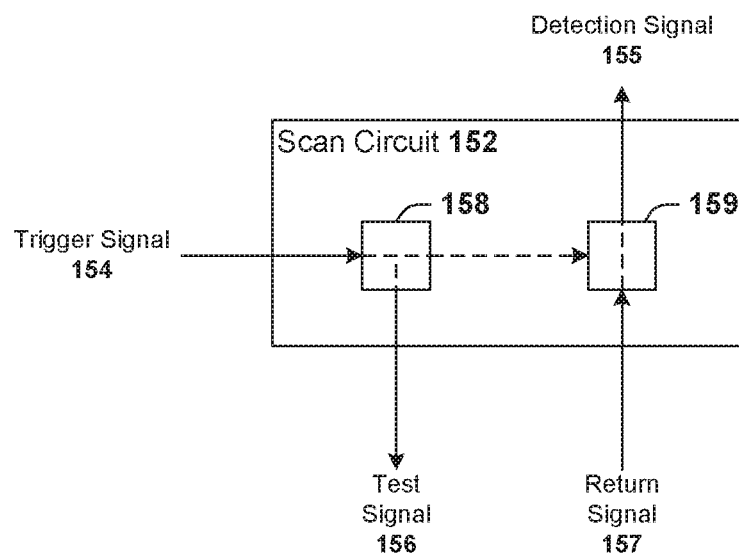
FIG. 5 illustrates a schematic block diagram of an exemplary, non-limiting embodiment of a scan circuit according to one or more aspects.

FIG. 5 illustrates a schematic block diagram of an exemplary, non-limiting embodiment of the scan circuit 152 according to one or more aspects. The scan circuit 152 can include a pair of circuits 158, 159, which are also referred to herein as a first cell 158 and a second cell 159. The pair of circuits 158, 159 are configured to pass test signal 156 to a designated electrical path of the electrical system 130, receive the return signal 157 from the electrical path, and evaluate the return signal 157 to determine whether the electrical fault is located on the electrical path.

First cell 158 can receive the trigger signal 154 from the control unit 110 and, in response, apply the test signal 156 to the electrical path. According to one example, the test signal 156 can be generated by the circuit implementing the first cell 158. In another example, the control unit 110 can generate the test signal 156 and the first cell 158 can pass the test signal 156 through to the electrical path. For instance, the trigger signal 154 can be the test signal 156, with or without modification by the first cell 158.

Second cell 159 can receive the secondary or return signal 157 from the electrical path. The second cell 159, in an aspect, can include an evaluation circuit which analyzes the return signal 157 to determine whether the electrical fault exists on the electrical path. In one example, the evaluation circuit can compare the test signal 156 to the return signal 157 to determine a difference. The difference can be measured against a threshold that, when exceeded, triggers the second cell 159 to emit the detection signal 155. According to another example, the second cell 159 can merely pass through the return signal 157 to the control unit 110, which evaluates the signal to determine whether the electrical fault exists on the electrical path associated with the scan circuit 152. For instance, a diagnostic application or program stored on memory 114 can be executed by processor 112 to generate trigger signal 154 (and/or test signal 154) and analyze detection signal 155 (and/or return signal 157).

Depending on the electrical path being tested, the first cell 158 and the second cell 159 can be implemented in a variety of manners providing different structural or functional aspects. Moreover, in the case of an electrical path associated with the control path 160, at least one of the first cell 158 or the second cell 159 can be associated with, coupled to, or included in the component control unit 144.

Figure 6:
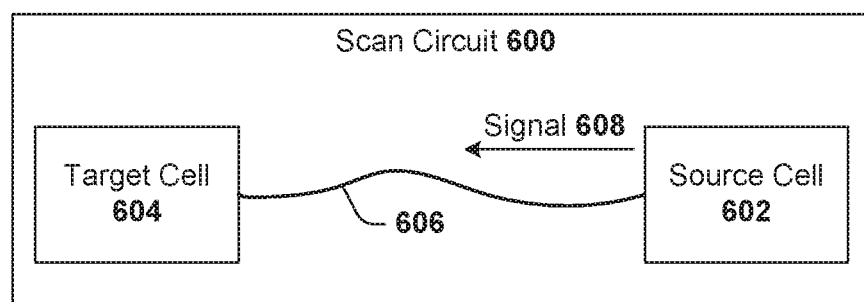
FIG. 6 illustrates a block diagram of an exemplary, non-limiting embodiment of a scan circuit schematically depicting structural and functional aspects of the scan circuit.

Turning to FIG. 6, illustrated is a block diagram of an exemplary, non-limiting embodiment of a scan circuit 600 for testing a wire or interconnection, according to an aspect. The scan circuit 600 includes a source cell 602 and a target cell 604 electrically coupled by a wire or interconnection 606. The source cell 602 applies a signal 608 (i.e., a test signal) to the wire 606, which is received by the target cell 604. The signal 608 can be evaluated by the target cell 604, or passed to a control system for evaluation, to determine whether an electrical fault is present along wire 606.

In an example, the source cell 602 can be associated with the fault location unit 150 or control unit 110 and the target cell 604 can be associated with the component control unit 144. The source cell 602 can be positioned at one terminal or boundary of the wire 606, which can be, for example, physically proximal to the control unit 110 or power supply 120. The target cell 604 can be positioned at another terminal or boundary of the wire 606 at a location physically remote from the control unit 110 or power supply 120.

Figure 7:
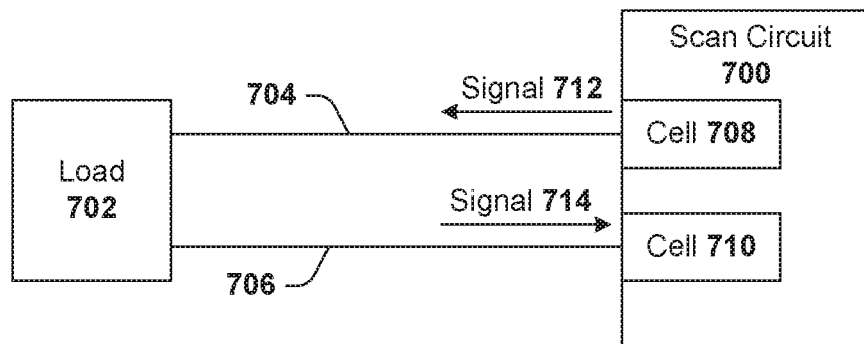
FIG. 7 illustrates a block diagram of an exemplary, non-limiting embodiment of a scan circuit schematically depicting structural and functional aspects of the scan circuit.

FIG. 7 illustrates a block diagram of an exemplary, non-limiting embodiment of a scan circuit 700 for testing a circuit for an electrical fault, according to an aspect. Scan circuit 700 is electrically coupled to a circuit or load 702 having a positive or hot wire 704 and a negative or neutral wire 706. Scan circuit 700 includes a first cell 708 that applies a first signal 712 on the positive wire 704 and a second cell 710 that receives a second signal 714 on the negative wire 706. The second signal 714 can be analyzed to determine whether an electrical fault is present in the circuit or load 702, positive wire 704, or negative wire 706.

Figure 8:
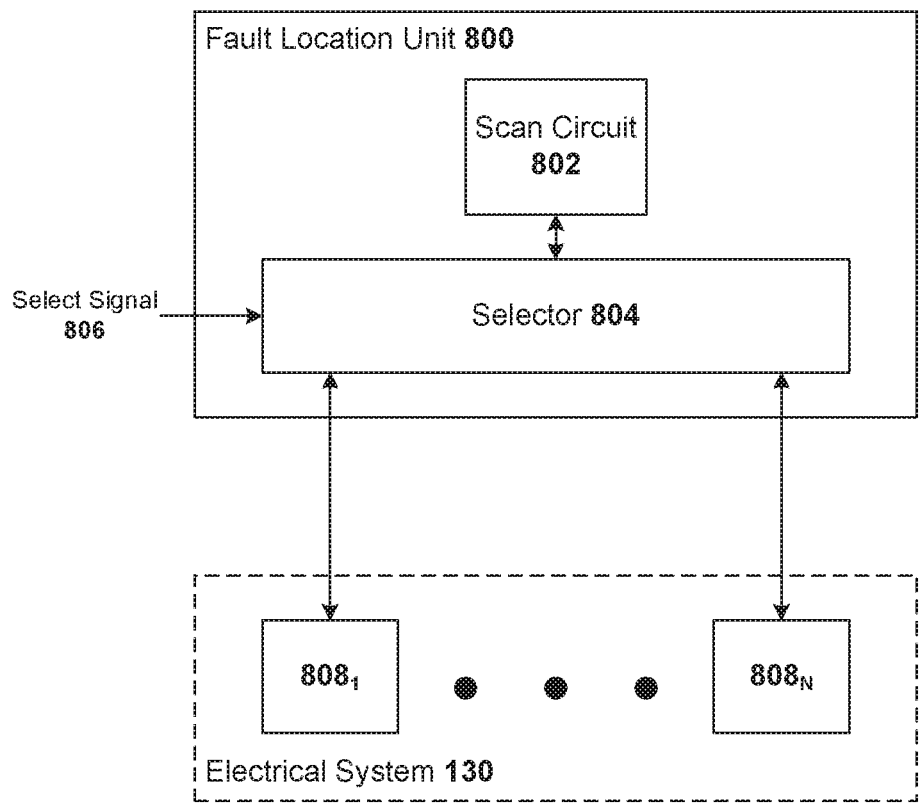
FIG. 8 illustrates a block diagram of an exemplary, non-limiting embodiment of a fault location unit for a vehicle in accordance with one or more aspects.

FIG. 8 illustrates a block diagram of an exemplary, non-limiting embodiment of a fault location unit 800 unit for a vehicle 100 in accordance with one or more aspects. Fault location unit 800 includes a scan circuit 802 and a selector 804. It is to be appreciated that scan circuit 802 can be substantially similar to and perform substantially similar functionality as scan circuits 152, 600, or 700 described above.

Scan circuit 802 is coupled to an input of selector 804, which can be a multiplexor or other routing circuit configured to selectively couple the input to one of a plurality of outputs. The output of the plurality of outputs is determined by a select signal 806. The select signal 806 can be generated by the fault location unit 800 itself, or externally provided by control unit 110 for example. The plurality of outputs of selector 804 are respectively coupled, electrically, to one or more portions or electrical paths 808 of the electrical system 130 (designated as electrical path 808.sub.1 through electrical path 808.sub.N, where N is any integer greater than or equal to one). By varying the select signal 806, the fault location unit 800 can cycle through the electrical paths 808 and test each one, individually, with scan circuit 802.

In view of the exemplary devices and systems described supra, methodologies that can be implemented in accordance with the disclosed subject matter are described with reference to the flow charts of FIGS. 9 and 10. The methodologies are shown and described as a series of blocks; however, the claimed subject matter is not limited by the order of the blocks, as some blocks can occur in different orders and/or concurrently with other blocks. Moreover, not all illustrated blocks may be required to implement the methods described hereinafter. The methodologies can be implemented by the system described above with respect to FIGS. 1-8, for example.

Figure 9:
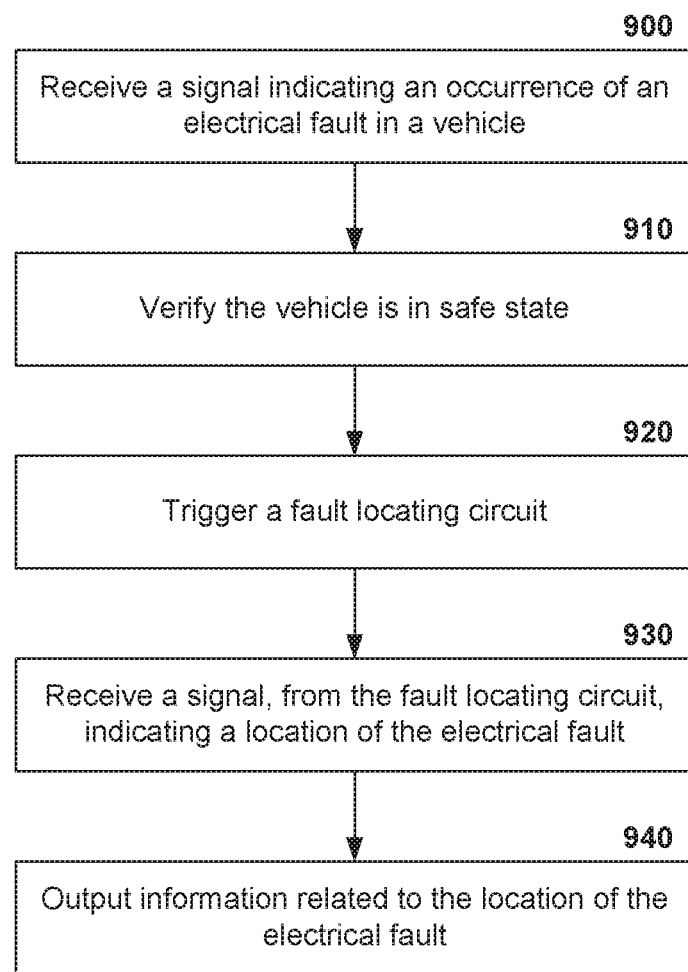
FIG. 9 illustrates a flow diagram of an exemplary, non-limiting embodiment of a method for locating a fault within an electrical system of a vehicle according to one or more aspects.

FIG. 9 illustrates a flow diagram of an exemplary, non-limiting embodiment of a method for locating a fault within an electrical system of a vehicle according to one or more aspects. At 900, a signal indicating an occurrence of an electrical fault in a vehicle is received. The signal can be generated by a sensor, for example, coupled to a power supply of the vehicle. At 910, it is verified that that vehicle is in a safe state. A control until of the vehicle, based on information or signals from various vehicle components, can determine a state of the vehicle. At 920, a fault locating circuit is triggered. In an example, the fault locating circuit can be electrically isolated from the electrical system of the vehicle, but electrically coupled to the electrical system in response to the signal received at 900. At 930, a signal is received from the fault locating circuit. The signal indicates a location of the electrical fault in the electrical system of the vehicle. At 940, the information related to the location of the electrical fault is output. For example, the information can be output to a display screen of a user interface or communicated, via a communication interface, to an entity remote from the vehicle.

Figure 10:
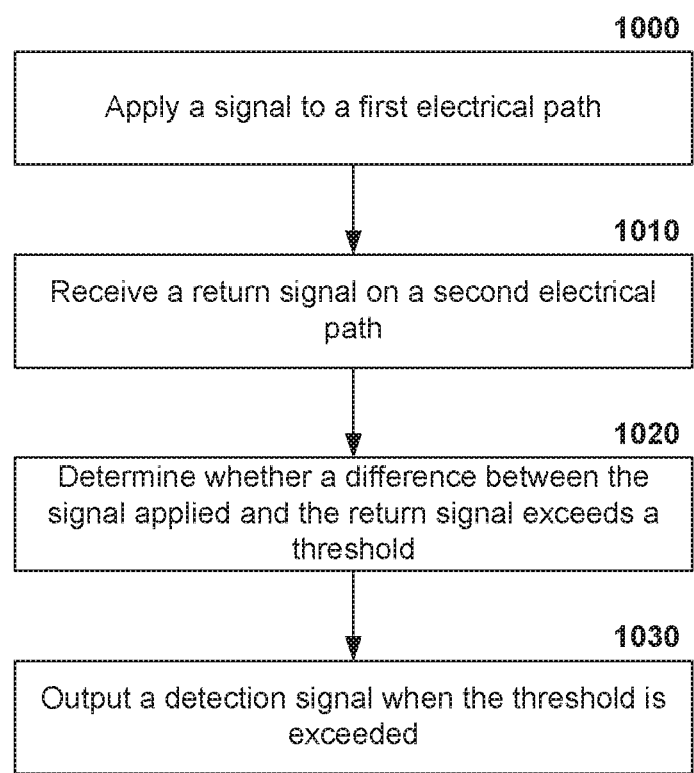
FIG. 10 illustrates a flow diagram of an exemplary, non-limiting embodiment of a method for identifying a location of a fault within an electrical system of a vehicle according to one or more aspects.

FIG. 10 illustrates a flow diagram of an exemplary, non-limiting embodiment of a method for identifying a location of a fault within an electrical system of a vehicle according to one or more aspects. At 1000, a signal is applied to a first electrical path. According to an example, the signal is provided by a scan circuit having a pair of cells, which is designated to the first electrical path. At 1010, a return signal is received on a second electrical path. It is to be appreciated that the first and second electrical paths can be a same path, or different paths. For example, when testing an individual length of wire, the first and second paths can be the same individual length of wire. Alternatively, when testing the individual length, the first electrical path can be the length of wire, while the second electrical path is another wire, wires, or circuit. Further still, when testing a circuit, for example, the first path can be a first set of wires (e.g., one or more wires) and the second path can be a second set of wires (e.g., one or more wires) that completes the circuit. In some embodiment or examples, the second electrical path can be known to be fault-free, such that the first electrical path is the portion under test. At 1020, it is determined, on the basis of the return signal, whether an electrical fault is present on the electrical path (e.g., either the first electrical path or second electrical path). For example, the signal applied and the return signal can be compared to determine whether a difference therebetween exceeds a threshold. At 1030, when determined that an electrical fault is present (e.g., the threshold is exceeded), a detection signal is output. It is to be appreciated that computing a difference signal and comparing said signal to a threshold is one exemplary technique to detect an electrical fault. Other techniques are applicable and are contemplated within the bounds of the claimed subject-matter unless explicitly detailed otherwise.

Figure 11:
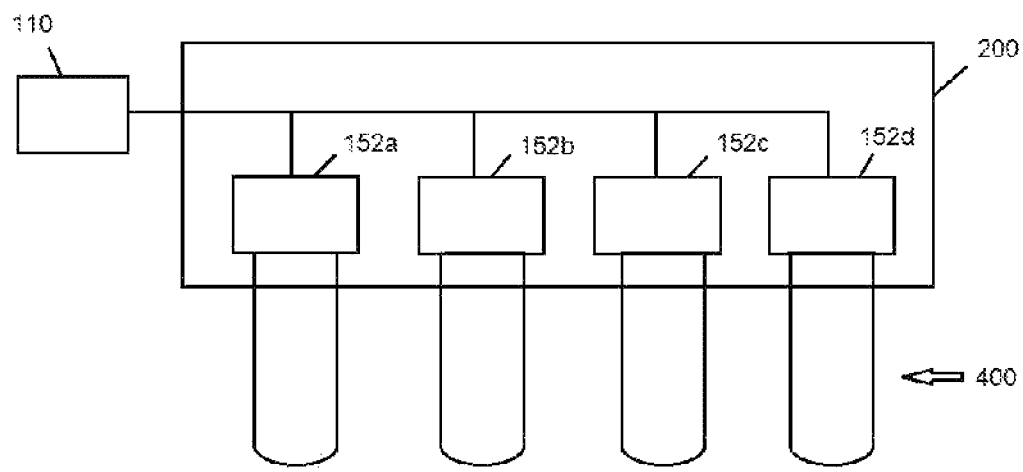
FIG. 11 is a wiring schematic of a fault location system, according to an embodiment.

FIG. 11 shows a wiring schematic of an embodiment of the fault location system. In particular, as illustrated, for each circuit of interest 400 (e.g., each circuit may be a wire loop/circuit) in the vehicle electrical system, a separate and distinct scan circuit 152*a*, 152*b*, 152*c*, 152*d*, etc. is respectively connected to the circuit 400, e.g., in parallel. That is, in this embodiment, there is a scan circuit for each wire or other circuit portion of interest. In a given vehicle electrical system, this may mean the provision of hundreds or thousands of scan circuits. However, with mass produced, low cost micro-electronics currently available on the market, implementations on such a scale may nevertheless be practicable. Also, as should be appreciated, the scan circuits can be built into the electrical panels, circuit boards, etc. 200 to which the wire loops or other circuits are part of and/or electrically coupled, keeping implementation costs relatively low.

Figure 12:
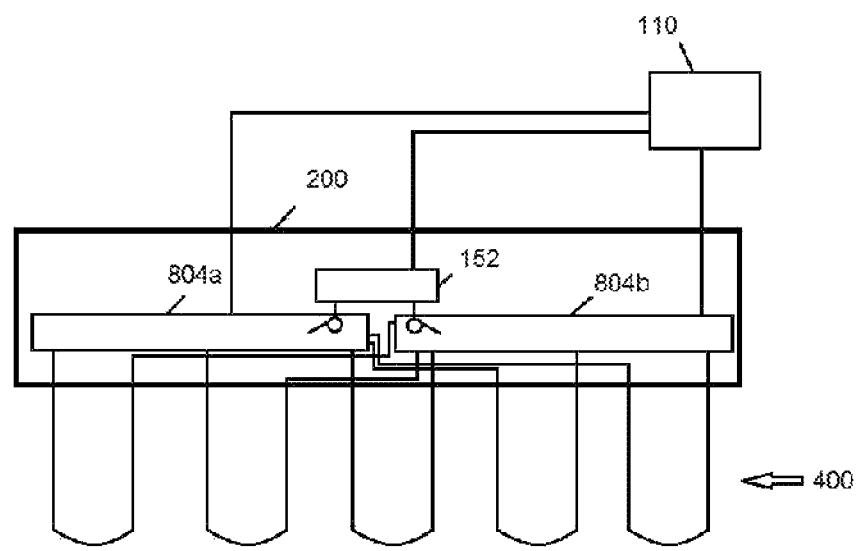
FIG. 12 is a wiring schematic of a fault location system, according to an embodiment.

FIG. 12 shows a wiring schematic of another embodiment of the fault location system. Here, the system includes one scan circuit 152 and a pair of selector units (e.g., multiplexers) 804*a*, 804*b*. The control unit 110 is configured to control the selector units 804*a*, 804*b*, one for selectively connecting the out path of each circuit 400 to the scan circuit and the other for selectively connecting the in path of each circuit to the scan circuit. The scan circuit is cyclically connected to the circuits for testing each in turn.

In an embodiment, a system (e.g., an electrical fault location detection system) includes plural scan circuits respectively electrically connected to plural electrical circuits in an electrical system of a vehicle and configured to apply respective electrical signals to the plural electrical circuits. The system further includes a control unit configured for electrical communication with the plural scan circuits in the vehicle. (The control unit may be located off board the vehicle, in which case the control unit may be configured to wirelessly communicate with the scan circuits on board the vehicle; in one embodiment, however, the control unit is located on board the vehicle and is electrically connected to the scan circuits either wirelessly or with wires.) The plural scan circuits are further configured to receive secondary signals respectively generated by the plural electrical circuits responsive to the electrical signals applied by the plural scan circuits to the plural electrical circuits, and to communicate information of the secondary signals that are received to the control unit. The control unit is configured to determine a location of an electrical fault in the electrical system based on the information received from the plural scan circuits. The control unit is further configured to control at least one electronic device based on the location of the electrical fault that is determined.

For example, in an embodiment, the at least one electronic device that the control unit is configured to control comprises (i) a display device of a user interface of the vehicle, for display of the location of the electrical fault in the electrical system, and/or (ii) a communication device, for communication of the location of the electrical fault in the electrical system to a device off board the vehicle. In another embodiment, the at least one electronic device that the control unit is configured to control comprises a vehicle system on board the vehicle. For example, the control unit may be configured to control the electrical system of the vehicle, an engine of the vehicle or another component of a propulsion system of the vehicle, etc., for operation from a first state to operation in a different, second state, such as the vehicle being brought from moving along a route to a stopped condition, or the electrical system (or portion thereof) being transitioned from an on or operational state to an off or non-operating state.

In an embodiment, the control unit is further configured to generate control signals for communication to the plural scan circuits, and the scan circuits are configured to apply the electrical signals to the plural electrical circuits responsive to the control signals.

In an embodiment, the system further includes a sensor configured to detect an occurrence of the electrical fault in the electrical system. The sensor is further configured to send a signal indicative of the occurrence of the electrical fault to the control unit when detected, and the control unit is configured to generate the control signals responsive to receipt of the signal indicative of the occurrence of the electrical fault. For example, the vehicle may include a power supply configured to provide electrical power to the electrical system of the vehicle, and in such an instance the sensor may be coupled to the power supply for detecting the electrical fault based on a change in electrical power output by the power supply (for example).

In an embodiment, the scan circuits are configured to be selectively electrically coupled to the plural electrical circuits, and to electrically couple to the plural electrical circuits responsive to the control signals. For example, the scan circuits may be connected to the vehicle electrical circuits by respective switches, which the control unit is configured to control with the control signals. In an embodiment, the control unit is configured to verify the vehicle is in a designated operational state (e.g., a safe state, such as stopped at a designated location) as a condition precedent for generating the control signals to electrically couple the scan circuits to the electrical system.

In an embodiment, the system further includes a coupling circuit (e.g., one or more multiplexer circuits) configured, in a first mode of operation under control of the control unit, to selectively couple the scan circuits to the electrical system, and in a second mode of operation under control of the control unit to isolate the scan circuits from the electrical system.

In an embodiment, the scan circuit includes an evaluation circuit that is configured to determine a comparison of the respective one of the electrical signals applied to the electrical circuit (the electrical circuit to which the scan circuit is electrically connected) to a respective one of the secondary signals generated by the electrical circuit responsive to the respective one of the electrical signals applied to the electrical circuit, and the evaluation circuit may be configured to output a detection signal based on the comparison, the detection signal including the information communicated to the control unit.

In an embodiment, the scan circuit further includes a first cell and a second cell. The first cell is configured to apply the respective one of the electrical signals to a first wire of the electrical circuit. The second cell is configured to receive the respective one of the secondary signals on a second wire of the electrical circuit that completes the electrical circuit.

In an embodiment, the scan circuit includes a first cell and a second cell, and the electrical circuit comprises a length of wire. The first cell is configured to apply the respective one of the electrical signals on the length of wire, and the second cell is configured to receive the respective one of the secondary signals on the length of wire.

In an embodiment, a system (e.g., an electrical fault location detection system) includes at least one scan circuit on board a vehicle, a control unit, and a coupling circuit (e.g., one or more multiplexer circuits) on board the vehicle. The coupling circuit is electrically connected to the at least one scan circuit and to plural electrical circuits of an electrical system of the vehicle. The control unit is configured to control the coupling unit to selectively electrically couple the at least one scan circuit to the plural electrical circuits. The at least one scan circuit is configured, when electrically coupled to the electrical circuits, to apply respective electrical signals to the plural electrical circuits and to receive secondary signals respectively generated by the plural electrical circuits responsive to the electrical signals. The at least one scan circuit is further configured to communicate information of the secondary signals that are received to the control unit. The control unit is configured to determine a location of an electrical fault in the electrical system based on the information received from the at least one scan circuit. The control unit is further configured to control at least one electronic device based on the location of the electrical fault that is determined.

In an embodiment, a system (e.g., an electrical fault location detection system) includes at least one scan circuit on board a vehicle, a control unit, and a coupling circuit (e.g., multiplexer circuit) on board the vehicle. The coupling circuit is electrically connected to the at least one scan circuit and to plural electrical circuits of an electrical system of the vehicle. The control unit is configured to control the coupling unit to selectively electrically couple the at least one scan circuit to the plural electrical circuits. The at least one scan circuit is configured, when electrically coupled to the electrical circuits, to apply respective electrical signals to the plural electrical circuits and to receive secondary signals respectively generated by the plural electrical circuits responsive to the electrical signals. The at least one scan circuit is further configured to communicate information of the secondary signals that are received to the control unit. The control unit is configured to determine a location of an electrical fault in the electrical system based on the information received from the at least one scan circuit. The control unit is further configured to control at least one electronic device based on the location of the electrical fault that is determined, and to control the coupling circuit to individually and cyclically couple a single one of the at least one scan circuit to the plural electrical circuits to test each of the plural electrical circuits for the electrical fault. (That is, one scan circuit is connected to an individual electrical circuit for testing, and is then disconnected from that circuit for re-connection to another electrical circuit, and so on until all circuits are tested.) Further, the at least one electronic device that the control unit is configured to control may include a vehicle system on board the vehicle.

In an embodiment, a system (e.g., an electrical fault location detection system) includes at least one scan circuit on board a vehicle, a control unit, a coupling circuit (e.g., multiplexer circuit) on board the vehicle, and a sensor configured to detect an occurrence of the electrical fault in the electrical system. The coupling circuit is electrically connected to the at least one scan circuit and to plural electrical circuits of an electrical system of the vehicle. The control unit is configured to control the coupling unit to selectively electrically couple the at least one scan circuit to the plural electrical circuits. The at least one scan circuit is configured, when electrically coupled to the electrical circuits, to apply respective electrical signals to the plural electrical circuits and to receive secondary signals respectively generated by the plural electrical circuits responsive to the electrical signals. The at least one scan circuit is further configured to communicate information of the secondary signals that are received to the control unit. The control unit is configured to determine a location of an electrical fault in the electrical system based on the information received from the at least one scan circuit. The control unit is further configured to control at least one electronic device based on the location of the electrical fault that is determined. The sensor is configured to send a signal indicative of the occurrence of the electrical fault to the control unit when detected, and the control unit is configured to control the coupling unit to electrically couple the at least one scan circuit to the plural electrical circuits responsive to receipt of the signal indicative of the occurrence of the electrical fault.

In the specification and claims, reference will be made to a number of terms that have the following meanings. The singular forms "a", "an" and "the" include plural referents unless the context clearly dictates otherwise. Approximating language, as used herein throughout the specification and claims, may be applied to modify a quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Moreover, unless specifically stated otherwise, a use of the terms "first," "second," etc., do not denote an order or importance, but rather the terms "first," "second," etc., are used to distinguish one element from another.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be."

This written description uses examples to disclose the invention, including the best mode, and also to enable one of ordinary skill in the art to practice the invention, including making and using a devices or systems and performing incorporated methods. The patentable scope of the invention is defined by the claims, and may include other examples that occur to one of ordinary skill in the art. Such other examples are intended to be within the scope of the claims if they have structural elements that do not differentiate from the literal language of the claims, or if they include equivalent structural elements with insubstantial differences from the literal language of the claims.

What is claimed is:

1. A system comprising:
   a location unit configured to direct a distribution of electrical signals through different conductive pathways to several components of an electric system of a vehicle, the location unit configured to receive a modified version of one or more of the electric signals, wherein the one or more electric signals is changed into the modified version by one or more of the conductive pathways, the location unit configured to determine a location of an electric fault in the electric system based on a measurement position where the modified version of the one or more electric signals is measured and an application position where the one or more electric signals is changed into the modified version and
   a coupling unit under control of a control unit and configured to maintain the location unit in isolation until receipt of a signal from a sensor that the electrical fault occurs.

2. The system of claim 1, wherein the location unit is configured to direct the distribution of the electric signals through the conductive pathways that are used to conduct control signals to the electric system of the vehicle for control of movement of the vehicle.

3. The system of claim 1, wherein the location unit is configured to determine the location of the electric fault by comparing at least one of the electric signals in the distribution with the modified version of the one or more electric signals.

4. The system of claim 1, wherein the location unit includes plural scan circuits each configured to direct a subset of the distribution of the electric signals into a different portion of the electric system and determine the location of the electric fault within the corresponding portion of the electric system.

5. The system of claim 1, wherein:
   the coupling unit is configured to disconnect the location unit from the electric system of the vehicle based on an operating state of the vehicle.

6. The system of claim 1, wherein:
   the control unit is configured to prevent the location unit from directing the distribution of the electrical signals through the conductive pathways unless the vehicle is in a state where the distribution of the electric signals does not change or cause movement of the vehicle.

7. The system of claim 1, wherein the location unit is configured to determine the location of the electric fault as the location of an electric short.

8. A method comprising:
   directing a distribution of electrical signals through different conductive pathways to several components of an electric system of a vehicle;
   receiving a modified version of one or more of the electric signals, wherein the one or more electric signals is changed into the modified version by one or more of the conductive pathways;
   determining a location of an electric fault in the electric system based on a measurement position where the modified version of the one or more electric signals is measured and an application position where the one or more electric signals is changed into the modified version; and
   isolating a location unit that generates the distribution of the electric signals, from the electric system of the vehicle until receipt of a signal from a sensor that the electrical fault occurs.

9. The method of claim 8, wherein the distribution of the electric signals is directed through the conductive pathways that are used to conduct control signals to the electric system of the vehicle for control of movement of the vehicle.

10. The method of claim 8, wherein the location of the electric fault is determined by comparing at least one of the electric signals in the distribution with the modified version of the one or more electric signals.

11. The method of claim 8, wherein directing the distribution of electric signals into the electric system includes directing a subset of the distribution of the electric signals into each of plural, different portions of the electric system and determining the location of the electric fault within at least one of the portions of the electric system.

12. The method of claim 8, further comprising: preventing the location unit that generates the distribution of the electric signals from generating the electric signals unless the vehicle is in a state where the distribution of the electric signals does not change or cause movement of the vehicle.

13. The method of claim 8, wherein the location of the electric fault is determined as the location of an electric short.

14. A system comprising:
   a location unit configured to direct electrical signals through different conductive pathways to several components of an electric system of a vehicle, the location unit configured to receive a modified version of one or more of the electric signals, wherein the one or more electric signals is changed into the modified version by one or more of the conductive pathways, the location unit configured to determine a location of an electric fault in the electric system based a difference between (a) at least one of the electric signals and (b) the modified version of the one or more electric signals;
   a control unit configured to prevent the location unit from directing the electrical signals through the conductive pathways unless the vehicle is in a state where the electric signals do not change or cause movement of the vehicle; and a coupling unit under control of the control unit and configured to maintain the location unit in isolation until receipt of a signal from a sensor that the electrical fault occurs.

15. The system of claim 14, wherein the location unit is configured to determine the location of the electric fault also based on a measurement position where the modified version of the one or more electric signals is measured and an application position where the one or more electric signals that is changed into the modified version.

16. The system of claim 14, wherein the location unit is configured to direct the electric signals through the conductive pathways that are used to conduct control signals to the electric system of the vehicle for control of movement of the vehicle.

17. The system of claim 14, wherein the location unit includes plural scan circuits each configured to direct a subset of the electric signals into a different portion of the electric system and determine the location of the electric fault within the corresponding portion of the electric system.

18. The system of claim 14, wherein the coupling unit is configured to disconnect the location unit from the electric system of the vehicle based on an operating state of the vehicle.

19. The system of claim 14, wherein the location unit is configured to determine the location of the electric fault as the location of an electric short.

\* \* \* \* \*